United States Patent
Balakrishnan

(10) Patent No.: US 11,194,382 B2
(45) Date of Patent: Dec. 7, 2021

(54) SPECULATIVE EXIT FROM POWER DOWN MODE OF A DYNAMIC RANDOM ACCESS MEMORY RANK

(71) Applicant: ADVANCED MICRO DEVICES, INC., Santa Clara, CA (US)

(72) Inventor: Kedarnath Balakrishnan, Bangalore (IN)

(73) Assignee: ADVANCED MICRO DEVICES, INC., Santa Clara, CA (US)

(*) Notice: Subject to any disclaimer, the term of this patent is extended or adjusted under 35 U.S.C. 154(b) by 21 days.

(21) Appl. No.: 16/162,215

(22) Filed: Oct. 16, 2018

(65) Prior Publication Data

US 2020/0117265 A1 Apr. 16, 2020

(51) Int. Cl.
G06F 1/32 (2019.01)
G06F 1/3287 (2019.01)
(Continued)

(52) U.S. Cl.
CPC .......... G06F 1/3287 (2013.01); G06F 1/324 (2013.01); G06F 1/3225 (2013.01); G06F 1/3228 (2013.01); G06F 1/3275 (2013.01); G06F 1/3296 (2013.01); G06F 11/3423 (2013.01); G06F 13/1689 (2013.01); G11C 7/222 (2013.01)

(58) Field of Classification Search
CPC ........ G06F 1/3202; G06F 1/3231; G06F 1/26; G06F 1/206; G06F 1/3228; G06F 1/08; G06F 1/3289; G06F 1/266; H04L 12/12; H04L 12/10
See application file for complete search history.

(56) References Cited

U.S. PATENT DOCUMENTS 7,739,461 B2    6/2010  Hur et al.
7,796,458 B2 *  9/2010  Rao .......................... G11C 5/14
                                                          365/226
(Continued)

FOREIGN PATENT DOCUMENTS

WO    2009158275 A1    12/2009

OTHER PUBLICATIONS

International Search Report and Written Opinion dated Oct. 8, 2019 for International Application No. PCT/US2019/038952, 12 pages.
(Continued)

*Primary Examiner* — Zahid Choudhury

(57) ABSTRACT

A processing system includes a memory controller that preemptively exits a dynamic random access (DRAM) integrated circuit rank from a low power mode such as power down mode based on a predicted time when the memory controller will receive a request to access the DRAM rank. The memory controller tracks how long after a DRAM rank enters the low power mode before a request to access the DRAM rank is received by the memory controller. Based on a history of the timing of access requests, the memory controller predicts for each DRAM rank a predicted time reflecting how long after entering low power mode a request to access each DRAM rank is expected to be received. The memory controller speculatively exits the DRAM rank from the low power mode based on the predicted time and prior to receiving a request to access the DRAM IC rank.

19 Claims, 4 Drawing Sheets

(51) Int. Cl.

| | |
|---|---|
| *G06F 1/324* | (2019.01) |
| *G06F 1/3296* | (2019.01) |
| *G11C 7/22* | (2006.01) |
| *G06F 1/3234* | (2019.01) |
| *G06F 13/16* | (2006.01) |
| *G06F 1/3228* | (2019.01) |
| *G06F 1/3225* | (2019.01) |
| *G06F 11/34* | (2006.01) |

(56) References Cited

U.S. PATENT DOCUMENTS

| | | | |
|---|---|---|---|
| 8,503,264 B1 * | 8/2013 | Narayanan | G11C 5/14 |
| | | | 365/226 |
| 9,001,608 B1 * | 4/2015 | Chishti | G11C 11/40611 |
| | | | 365/149 |
| 9,904,623 B2 | 2/2018 | Govindan et al. | |
| 10,403,333 B2 * | 9/2019 | Brandl | G06F 12/1018 |
| 10,503,670 B2 * | 12/2019 | Shen | G06F 13/1636 |
| 2005/0243635 A1 | 11/2005 | Schaefer | |
| 2010/0162020 A1 | 6/2010 | Maule et al. | |
| 2014/0032803 A1 * | 1/2014 | Gupta | G06F 13/362 |
| | | | 710/113 |
| 2014/0181556 A1 * | 6/2014 | Eckert | G06F 1/324 |
| | | | 713/323 |
| 2014/0208144 A1 * | 7/2014 | Ma | G06F 1/3275 |
| | | | 713/324 |
| 2016/0154452 A1 * | 6/2016 | Hansson | G06F 1/3287 |
| | | | 713/323 |
| 2017/0371795 A1 * | 12/2017 | Wang | G06F 12/123 |

OTHER PUBLICATIONS

Fan, Xiaobo et al., "Memory Controller Policies for DRAM Power Management", IEEE Proceedings of the 2001 International Symposium on Low Power Electronics and Design; Aug. 6-7, 2001; 6 pages.

International Report on Patentability issued in Application No. PCT/US2019/038952 dated Apr. 29, 221, 9 pages.

* cited by examiner

SPECULATIVE EXIT FROM POWER DOWN MODE OF A DYNAMIC RANDOM ACCESS MEMORY RANK

BACKGROUND

Computer systems frequently use arrays of dynamic random access memory (DRAM) integrated circuits (ICs) for main memory. For example, a conventional dual in-line memory module (DIMM) is implemented as a set of DRAM ICs mounted on a printed circuit board. A DIMM consists of one or more ranks, in which each rank is a set of DRAM ICs connected to the same control line, or chip select, such that they are accessed by a memory controller simultaneously. To promote energy efficiency, DRAM ICs can be placed in a number of power states, such as active, standby, nap, power down, and self-refresh. A memory controller controls the power states of a plurality of DRAM ranks on a rank-by-rank basis via the chip select. For example, power down is a low power state of DRAMs, having a power consumption that is a fraction (e.g., 1%) of the active power state, but that also requires a delay for clock synchronization to re-enter the active state. Other low power modes have different entry and exit delays. When a memory controller experiences a gap in access requests to a DRAM rank, the memory controller ensures that conditions for entering power down mode are met and then sends a power down entry command to the DRAM rank via the chip select. When the memory controller receives a new request from a processor core to access the DRAM rank, the memory controller sends a power down exit command to the DRAM rank. However, the memory controller must then wait for the DRAM rank to exit power down mode and transition to active mode before accessing the DRAM, resulting in a latency penalty for using power down mode.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

FIGS. 1-4 illustrate systems and techniques for preemptively exiting a DRAM rank from a low power mode such as power down mode based on a predicted time when a memory controller of the DRAM rank will receive a request to access the DRAM rank. The memory controller tracks how long after a DRAM rank enters low power mode before a request to access the DRAM rank is received by the memory controller. Based on a history of the timing of access requests, the memory controller predicts for each DRAM rank a predicted time reflecting how long after entering low power mode a request to access each DRAM rank is expected to be received. The memory controller speculatively sends a low power mode exit command to the DRAM rank based on the predicted time and prior to receiving a request to access the DRAM rank. In some embodiments, the memory controller sends the low power mode exit command prior to the predicted time based on a number of clock cycles the DRAM rank requires to exit the low power mode and transition back to the active state.

The memory controller monitors how long after each DRAM rank preemptively exits the low power mode before a request to access each DRAM rank is received by the memory controller and adjusts the predicted time for each DRAM rank based on the history of access requests. Similarly, in the event the memory controller receives a demand access request for a DRAM rank prior to the predicted time, such that the memory controller must wait for the DRAM rank to exit the low power mode and transition back to the active state (i.e., a low power mode exit latency, or a power down exit latency), the memory controller adjusts the predicted time based on a power down exit latency penalty suffered during the previous exit from the low power mode for the affected DRAM rank.

Figure 1:
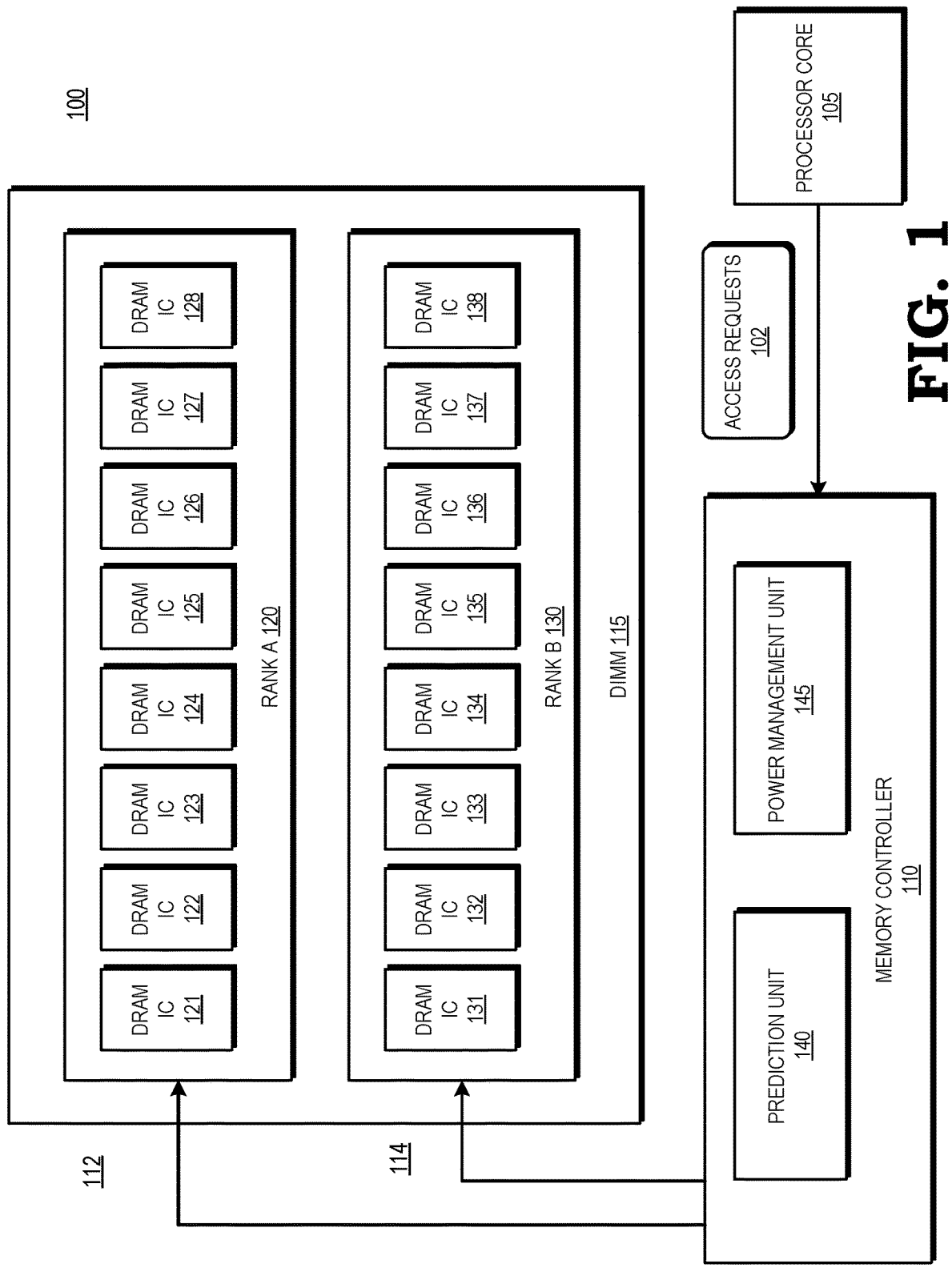
FIG. 1 is a block diagram of a processing system including a memory controller employing speculative exit from power down of ranks of a DRAM in accordance with some embodiments.

FIG. 1 illustrates block diagram of a processing system 100 including a memory controller 110 employing speculative exit from power down mode of ranks of a DRAM in accordance with some embodiments. The processing system 100 includes, for example, a server, a desktop computer, laptop computer, tablet computer, mobile phone, gaming console, and the like. The processing system 100 includes a memory subsystem consisting of memory modules to store data to be accessed by instructions executing at a processor core 105. The memory subsystem is organized into a memory hierarchy having main memory at the top of the hierarchy to store all data that can be accessed by the executing instructions, and one or more caches at lower levels of the memory hierarchy to store subsets of the data stored at main memory. If data required by the processor core 105 is not found at a cache of the memory hierarchy, a cache controller issues a memory access request to the memory controller to retrieve the data from main memory. In the depicted example, the processing system 100 includes one or more processor cores 105 coupled to the memory controller 110 and a DIMM 115 that includes two ranks of DRAM ICs, rank A 120 and rank B 130. In some embodiments, the memory controller 110 controls more than two ranks of DRAM ICs.

The one or more processor cores 105 are implemented as central processing units (CPUs) or graphics processing units (GPUs), or a combination thereof, and include various stages or components used in executing instructions from an operating system or application being executed by the processor core 105, such as a prefetcher (not shown), an integer execution unit or arithmetic logic unit (ALU) (not shown), a floating point unit (FPU) (not shown), a retirement unit (not shown), and the like. The one or more processor cores 105 further include one or more caches (not shown) that form a cache hierarchy for temporarily storing data, including instructions, that may be accessed by the execution pipeline with less latency than a memory access to the DIMM 115.

The memory controller 110 provides a variety of interface functions for the one or more processor cores 105, including interfacing with the DIMM 115. In addition, the memory controller 110 provides power management functionality for the DIMM 115. To this end, the memory controller 110 includes a power management unit 145 coupled to a prediction unit 140. The power management unit 145 controls the power states of rank A 120, via chip select 112, and rank B 130, via chip select 114, of the DIMM 115.

In at least one embodiment, rank A 120 and rank B 130 of the DIMM 115 have at least two general modes: an active mode, in which the DRAM ICs 121-128 of rank A 120 and DRAM ICs 131-138 of rank B 130 are servicing memory access requests, such as performing read and write transactions, and a power down mode, in which the DRAM ICs 121-128 of rank A 120 and DRAM ICs 131-138 of rank B 130 are not servicing memory access requests and in which power consumption is significantly lower than power consumption during active mode. While in the active mode, the DRAM ICs 121-128 of rank A 120 and the DRAM ICs 131-138 of rank B 130 employ any of a number of different performance states or operating points, with corresponding pairings of clock frequency and voltage, as controlled by the power management unit 145. When a DRAM rank is idle, the power management unit 145 places the DRAM rank in power down mode if the power management unit 145 determines that conditions for power down mode, such as an anticipated gap in access requests to the DRAM rank, are met. There is overhead associated with entering and exiting power down mode in terms of energy costs and performance costs such as latency associated with delays for clock resynchronization. For example, if the memory controller 110 receives a request to access a DRAM rank that is in power down mode (i.e., an "on-demand" exit from power down mode), the memory controller 110 will have to restore the DRAM rank to active mode by sending a power down exit (PDX) command and then waiting for a number of clock cycles for the DRAM rank to resynchronize and complete a transition to active mode (exit power down (tXP) cycles) before sending a read or write command to the DRAM rank. Accordingly, an on-demand exit from power down mode adds additional latency to a request to access a DRAM, especially in "unloaded" or "lightly loaded" scenarios. An unloaded scenario occurs when the memory controller 110 receives a request to access a DRAM IC 121-128 or 131-138 after a gap of time (e.g., when a processor is exiting an idle state such as after waking from a sleep mode). A lightly loaded scenario occurs when the memory controller 110 receives relatively few requests for the DRAM IC 121-128 or 131-138 such that the latency of the memory DIMM 115 is a significant factor in overall latency.

To mitigate the penalty for receiving a request to access a DRAM rank while the DRAM rank is in power down mode, the prediction unit 140 predicts the duration of the current power down mode (i.e., the iteration of the power down mode with the DRAM rank has entered, or is about to enter) for each DRAM rank, and thus predict when the exit from the power down mode is to occur. The prediction unit 140 uses any of a variety of prediction methodologies in estimating or otherwise predicting the duration of the current power down mode. For example, in some embodiments, the prediction unit 140 stores and analyzes information regarding respective durations (i.e., from a first time at which the DRAM rank enters a power down mode until a second time when the memory controller 110 receives a request from the processor core 105 to access the DRAM rank) of a number of previously occurring power down modes for each DRAM rank. The duration information for each DRAM rank is arranged in bins and the prediction unit 145 then predicts the duration of the current power down mode for each DRAM rank based on this binned information. In other embodiments, the prediction unit 140 uses a different prediction process, such as assuming a predefined average duration for all power down modes for each DRAM rank, employing a lookup table or other data structure that is pre-populated with defined average power down mode durations based on various criteria, such as the history of accesses to the DRAM rank prior to entry into the power down mode, and the like.

Using the predicted power down mode duration provided by the prediction unit 140, the power management unit 145 determines when to speculatively exit each DRAM rank from power down mode before receiving a request to access the DRAM rank to reduce the latency associated with an on-demand exit from power down mode. In at least one embodiment, the power management unit 145 triggers the exit power down process prior to the predicted power down mode duration so that the DRAM rank has, at the time of the termination of the predicted power down mode duration, already gone through the number of tXP cycles necessary to resynchronize and transition to the active state in order to service incoming memory access requests.

To illustrate, in operation, the processor core 105 sends access requests 102 to the memory controller 110 requesting access to data and instructions stored at the DIMM 115. The prediction unit 140 of the memory controller 110 tracks accesses to the DRAM ICs 121-128 of rank A 120 and to DRAM ICs 131-138 of rank B 130. Based on patterns in requests to access each of rank A 120 and rank B 130, the power management unit 145 determines whether conditions for power down mode, such as an anticipated gap in access requests to the DRAM rank, are met for an idle rank. When a DRAM rank is idle, the power management unit 145 places the DRAM rank in power down mode if the power management unit 145 determines that conditions for power down mode are met.

While the DRAM rank is in power down mode, the prediction unit 140 stores and analyzes information regarding the duration of the power down mode before the memory controller 110 receives a request from the processor core 105 to access a DRAM IC of the rank that is in power down mode. Based on this history of how long after the rank enters power down mode before an access request to access the rank is received at the memory controller 110, the prediction unit 140 predicts how long the next power down mode for that rank will last before a request to access the rank is received at the memory controller 110. In some embodiments, the prediction unit 140 predicts the power down mode duration for a rank based on an average number of clock cycles between the time when the rank enters power down mode and the time when the memory controller receives an access request to access the rank.

Based on the predicted duration of the power down mode for the rank, the power management unit 145 sends a preemptive PDX command to the rank prior to the predicted time that the memory controller 110 will receive a request to access the rank. The memory controller 110 waits for the number of tXP cycles necessary for the rank to resynchronize and transition to the active state, after which the memory controller 110 accesses the rank based on the next access request to the rank. The prediction unit 140 monitors how long after the exit from power down mode based on the preemptive PDX command before the memory controller 110 receives a request to access the rank. Based on a latency associated with the transition to active mode (or conversely, a too-early preemptive exit from power down mode), the prediction unit 140 adjusts the predicted power down mode duration for the rank.

The prediction unit 140 generates and adjusts predicted power down mode durations for each DRAM rank of a plurality of DRAM ranks. For example, in some embodiments, the processing system 100 includes a plurality of DIMMs 115, and each DIMM 115 includes one or more DRAM ranks 120, 130. Each DRAM rank 120, 130 within a DIMM 115 has a particular predicted power down mode duration based on access patterns to that particular DRAM rank 120, 130. Thus, the prediction unit 140 generates and adjusts a predicted power down mode duration corresponding to each of the plurality of DRAM ranks 120, 130.

Figure 2:
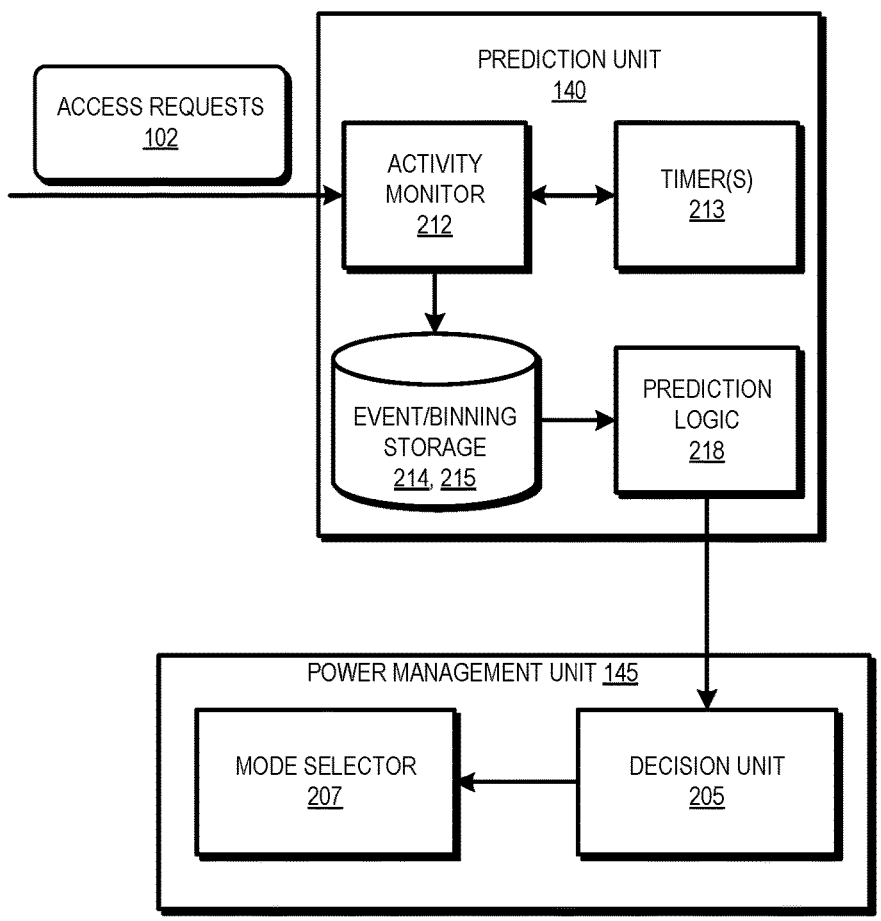
FIG. 2 is a block diagram illustrating a power management unit and prediction unit of the memory controller of FIG. 1 in accordance with some embodiments.

FIG. 2 is a block diagram illustrating the power management unit 145 and prediction unit 140 of the memory controller 110 of FIG. 1 in accordance with some embodiments. In the depicted example, the prediction unit 140 includes an activity monitor 212 coupled to receive indications of access requests directed to the various DRAM ranks 120, 130. The types of activity monitored by the activity monitor 212 include read and write requests to memory addresses located at DRAM ICs 121-128, 131-138 of the DRAM ICs 120, 130. The prediction unit 140 further includes a plurality of timers 213. One timer 213 may be included for each of the DRAM ranks for which activity is to be monitored. In some embodiments, each of the timers 213 is reset when activity is detected from its corresponding DRAM rank by the activity monitor 212. After being reset, a given timer 213 begins tracking the time since the most recent access request to the DRAM rank. Each timer 213 reports the time since activity was most recently detected in its corresponding DRAM rank. After placing a DRAM rank in power down mode, the power management unit 145 signals to the activity monitor 212 that the given DRAM rank is in power down mode. The activity monitor 212 records the time that the DRAM rank is in power down mode, based on the time value received from the corresponding timer 213, until the DRAM rank exits power down mode and resumes servicing access requests.

When a DRAM rank has resumed servicing access requests after having been in the power down mode, the activity monitor 212 records the duration of the power down mode in that DRAM rank in event storage 214. In the embodiment shown, the event storage 214 stores the duration for each of the most recent N instances of the power down mode, as power down mode times are being monitored for each of the DRAM ranks. In one embodiment, the event storage 214 includes a plurality of first-in, first-out (FIFO) memories, one for each DRAM rank. Each FIFO in the event storage 214 stores the duration of the most recent N instances of the power down mode for its corresponding DRAM rank. As the durations of new instances of power down modes are recorded in a FIFO corresponding to a given DRAM rank, in some embodiments the durations for the oldest power down mode instances are overwritten.

In some embodiments, binning storage 215 (illustrated as a single joint storage with event storage 214) stores, for each DRAM rank, counts of power down mode durations in corresponding bins in order to generate a distribution of power down mode durations. The binning storage 215 includes logic to read the recorded durations from the event storage 214 and generates the count values for each bin. As old duration data is overwritten by new duration with the occurrence of additional instances of the power down mode, the logic in the binning storage 215 updates the count values in the bins. Prediction logic 218 is coupled to the binning storage 215. Based on the distribution of power down mode durations for a given DRAM rank, prediction logic 218 generates a prediction as to the duration of the current power down mode. In some embodiments, the prediction logic 218 generates a prediction as to the duration of the current power down mode for a given DRAM rank based on an average of power down mode durations for that DRAM rank.

In addition to predictions for the duration of the power down mode, prediction logic 218 may also generate indications for specified times at which power down mode may be exited based on the power down mode duration predictions. For example, in one embodiment, if a DRAM rank is placed in a power down mode, the power management unit 145 causes that DRAM rank to exit the power down mode at a specified time based on the predicted power down mode duration. This exit from the power down mode is invoked without any other external event (e.g., receipt of an access request to that DRAM rank by the memory controller 110) that would otherwise cause an exit from the power down mode. Moreover, in some embodiments, the exit from the power down mode is invoked before the predicted duration of the power down mode has fully elapsed. If the prediction of power down mode duration is reasonably accurate, the preemptive exit from the power down mode provides various performance advantages. For example, resynchronization and transition to active mode occur before the memory controller 110 receives the next access request to the DRAM rank, thus enabling the DRAM rank to begin servicing access requests faster than it might otherwise be able to do so in the case of a reactive exit from the power down mode.

Predictions made by the prediction logic 218 are forwarded to a decision unit 205 of the power management unit 145. In the depicted embodiment, the decision unit 205 uses the prediction of power down mode time, along with other information, to determine when to preemptively exit a DRAM rank from a power down mode. The power management unit 145 further includes a mode selector 207 for sending power down entry (PDE) and power down exit (PDX) commands to the DRAM ranks. The mode selector 207 generates the commands based on information provided to it by the decision unit 205.

Figure 3:
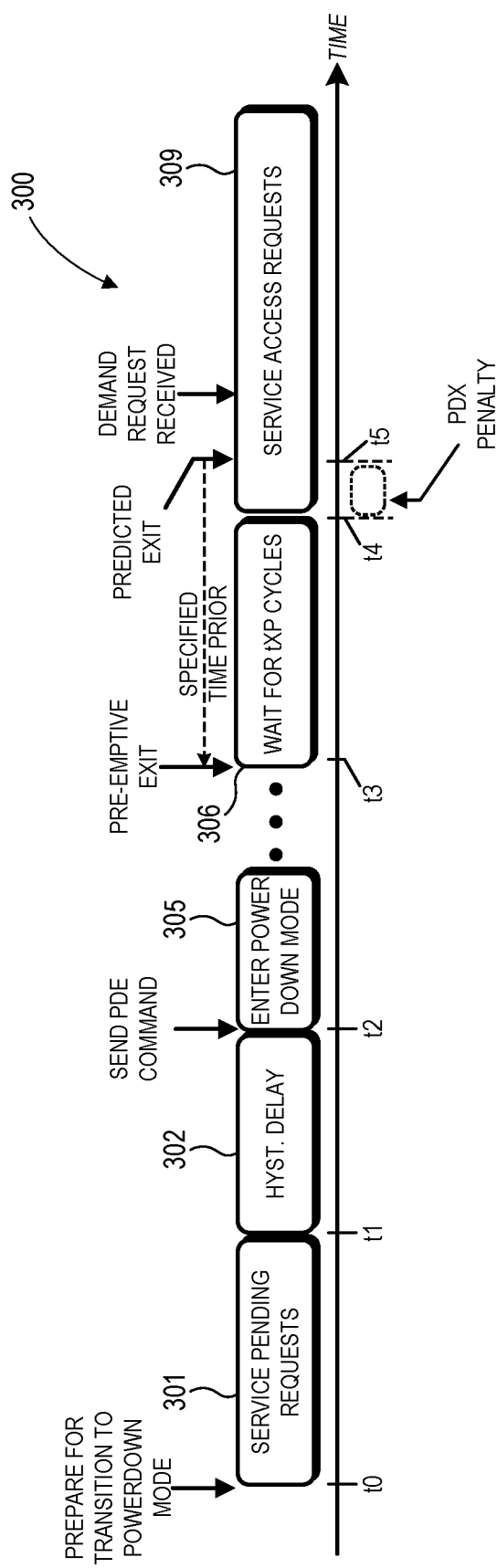
FIG. 3 is a diagram illustrating power down mode/active mode transition of a rank of a DRAM with speculative exit from power down mode in accordance with some embodiments.

FIG. 3 is a diagram illustrating a power down mode/active mode transition of a DRAM rank of FIG. 1 with speculative exit from power down mode in accordance with some embodiments. In particular, the timeline 300 depicted in FIG. 3 represents a sequence of events, or stages, occurring in the transition of a DRAM rank into a power down mode in response to the memory controller 110 determining that conditions for power down mode are met, and then a transition of the DRAM rank from the power down mode to an active mode so as to service incoming access requests.

At time t0, having determined that conditions for entering power down mode for the DRAM rank are met, the memory controller 110 prepares the DRAM rank to transition to power down mode. At stage 301, the DRAM rank finishes servicing outstanding access requests to the DRAM rank. At time t1, the memory controller 110 waits for a number of idle cycles to avoid hysteresis of the DRAM rank at stage 302. At time t2, the mode selector 207 of the power management unit 245 of the memory controller 110 sends a PDE command to the DRAM rank, triggering the DRAM rank to enter a power down mode at stage 305.

In the particular example of FIG. 3, the prediction unit 140 predicts an exit from power down mode at time t5 based on the predicted time that the next access request for the DRAM rank will be received by the memory controller 110. Based on the time of the predicted exit, the decision unit 205 determines that the DRAM rank is to preemptively exit power down mode at time t3, a predetermined number of cycles before the predicted exit. The mode selector 207 generates a PDX command to the DRAM rank based on the determination by the decision unit 205 to exit power down mode. Based on the PDX command, the DRAM rank begins the process of resynchronizing and transitioning to the active mode. The memory controller 110 waits at stage 306 for a predetermined number of tXP cycles until time t4 for the DRAM rank to complete the transition to active mode. By sending the PDX command a predetermined number of tXP cycles before the predicted exit, the memory controller 110 avoids or reduces the chance of incurring a PDX penalty in the event that the memory controller 110 will receive an access request for the DRAM rank before the transition to active mode is complete. Thus, beginning at time t4, the DRAM rank is in an active state, ready to service access requests at a stage 309.

Figure 4:
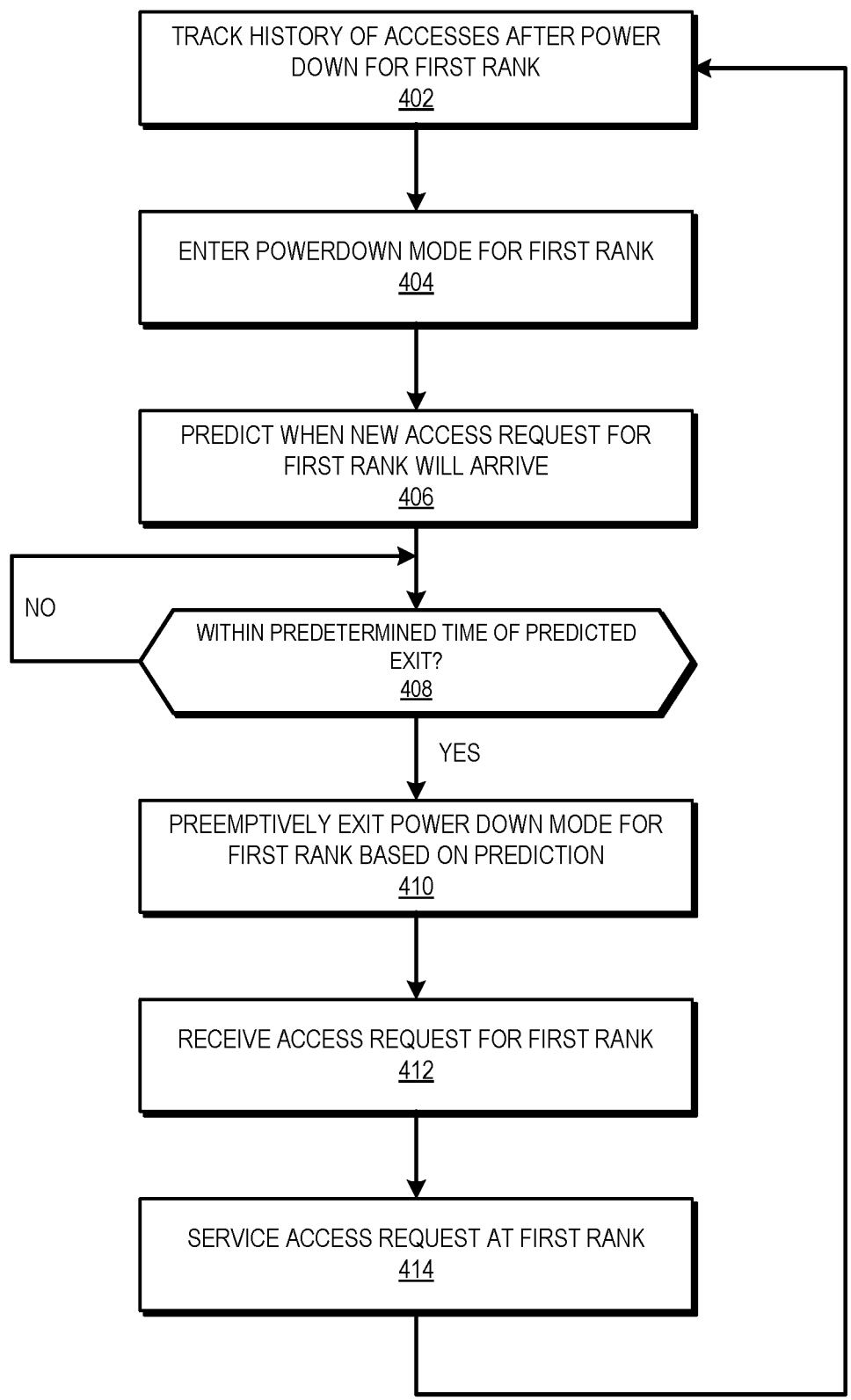
FIG. 4 is a flow diagram illustrating a method for speculatively exiting a power down mode of a rank of a DRAM in accordance with some embodiments.

FIG. 4 is a flow diagram illustrating a method 400 for speculatively exiting a power down mode of a DRAM rank of FIG. 1 in accordance with some embodiments. At block 402, the prediction unit 140 of the memory controller 110 tracks a history of access requests to the DRAM rank following entry of the DRAM rank into power down mode. At block 404, the mode selector 207 of the power management unit 145 sends a PDE command to the DRAM rank in response to the decision unit 205 determining that conditions for power down mode for the DRAM rank are met. At block 406, the prediction unit 140 predicts the duration that the DRAM rank will be in the power down mode before being transitioned back to an active mode by the memory controller 110 receiving an access request for the DRAM rank. As noted, the prediction unit 140 uses any of a variety of predictive exit techniques to predict this duration, such as based on a duration of a previous power down mode or an average of the previous N power mode durations for the DRAM rank.

With the predicted power down mode duration information from the prediction unit 140, at block 408 the power management unit 145 starts a countdown timer that is set to expire at a specified amount of time prior to the predicted exit from the power down mode. As described above, this specified time prior to the predicted exit may be a fixed amount of time, a predetermined number of clock cycles, and the like. Once the countdown time has expired, the power management unit 145 preemptively exits the DRAM rank from power down mode at block 410 by sending a PDX command to the DRAM rank based on the predicted power down mode duration. At block 412, the memory controller 110 receives an access request 102 to access the DRAM rank. At block 412, the DRAM rank services the access request 102.

A computer readable storage medium may include any non-transitory storage medium, or combination of non-transitory storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

In some embodiments, certain aspects of the techniques described above may implemented by one or more processors of a processing system executing software. The software includes one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:
1. A method comprising:
predicting, at a memory controller, a time that an access request to access a first rank of a dynamic random access memory (DRAM) integrated circuit in a low power mode is expected to be received at the memory controller, wherein predicting comprises:
storing, for each rank of a plurality of ranks of the DRAM integrated circuit, counts of low power mode duration instances based on a history of a number of clock cycles between a first time when a rank enters the low power mode and a second time when the memory controller receives an access request to access the rank; and predicting a duration of the low power mode of the first rank based on a distribution of the counts of low power mode duration instances of the first rank; and exiting the first rank from the low power mode prior to the predicted time.

2. The method of claim 1, wherein the predicting is based on an average number of clock cycles between a first time when the first rank enters the low power mode and a second time when the memory controller receives an access request to access the first rank.

3. The method of claim 1, wherein exiting the low power mode comprises exiting the low power mode a predetermined number of clock cycles before the predicted time that the access request will be received at the memory controller.

4. The method of claim 3, wherein the predetermined number of clock cycles is based on a low power mode exit latency for the first rank.

5. The method of claim 1, wherein the DRAM integrated circuit comprises a plurality of ranks, and the method further comprising:

predicting, at the memory controller, a time that an access request to access each rank of the DRAM in the low power mode will be received at the memory controller; and exiting each rank from the low power mode prior to the predicted time corresponding to the rank.

6. The method of claim 1, further comprising:

adjusting, at the memory controller, the predicted time based on a latency penalty associated with a previous exit from low power mode by the first rank.

7. A method, comprising:

storing, for a first rank of a plurality of ranks of a dynamic random access memory (DRAM) integrated circuit, counts of low power mode duration instances based on a history of a number of clock cycles between a first time when a rank enters the low power mode and a second time when the memory controller receives an access request to access the rank;

predicting a time when the memory controller will receive an access request to access the first rank based on a distribution of the counts of low power mode duration instances of the first rank; and exiting, at a memory controller, the first rank from a low power mode prior to receiving an access request to access the first rank and in response to the predicted time when the memory controller will receive an access request to access the first rank.

8. The method of claim 7, further comprising:

recording a duration of a power down mode for the first rank when the first rank has resumed servicing access requests after having been in the low power mode.

9. The method of claim 8, wherein the predicting is further based on an average number of clock cycles between a first time when the first rank enters the low power mode and a second time when the memory controller receives an access request to access the first rank.

10. The method of claim 7, wherein exiting the low power mode comprises exiting the low power mode a predetermined number of clock cycles before the predicted time that the access request will be received at the memory controller.

11. The method of claim 10, wherein the predetermined number of clock cycles is based on a low power mode exit latency for the first rank.

12. The method of claim 7, further comprising:

predicting, at the memory controller, a time that an access request to access each rank of the DRAM integrated circuit in the low power mode will be received at the memory controller; and exiting each rank from the low power mode prior to the predicted time corresponding to the rank.

13. The method of claim 7, further comprising:

adjusting, at the memory controller, the predicted time based on a latency penalty associated with a previous exit from low power mode by the first rank.

14. A device, comprising:

a dynamic random access memory (DRAM) integrated circuit comprising a plurality of ranks; and a memory controller to:

store, for each rank of the plurality of ranks, counts of low power mode duration instances based on a history of a number of clock cycles between a first time when a rank enters the low power mode and a second time when the memory controller receives an access request to access the rank; and predict a duration of the low power mode based on a predicted time that an access request to access a first rank of the DRAM integrated circuit in a low power mode will be received at the memory controller based on a distribution of the counts of low power mode duration instances of the first rank; and exit the first rank from the low power mode prior to the predicted time.

15. The device of claim 14, wherein the memory controller is to predict the time based on an average number of clock cycles after the first rank enters the low power mode before an access request to access the first rank is received at the memory controller.

16. The device of claim 15, wherein the memory controller is to exit the first rank from the low power mode a predetermined number of clock cycles before the predicted time that the access request will be received at the memory controller.

17. The device of claim 16, wherein the predetermined number of clock cycles is based on a low power mode exit latency for the first rank.

18. The device of claim 14, wherein the memory controller is further to:

predict a time that an access request to access each rank of the DRAM integrated circuit in the low power mode will be received at the memory controller; and exit each rank from the low power mode prior to the predicted time corresponding to the rank.

19. The device of claim 14, wherein the memory controller is further to adjust the predicted time based on a latency penalty associated with a previous exit from low power mode by the first rank.

* * * * *

UNITED STATES PATENT AND TRADEMARK OFFICE
CERTIFICATE OF CORRECTION

PATENT NO. : 11,194,382 B2
APPLICATION NO. : 16/162215
DATED : December 7, 2021
INVENTOR(S) : Kedarnath Balakrishnan Page 1 of 1

It is certified that error appears in the above-identified patent and that said Letters Patent is hereby corrected as shown below:

In the Claims

At Column 9 Line 39, please replace "a" after when and before rank with "the first"

At Column 9 Line 39, please replace "the" after enters and before low with "a"

At Column 9 Line 40, please replace "the" after when and before memory with "a"

At Column 9 Line 41, please insert --first-- after the and before rank

At Column 10 Line 25, please replace "the" after enters and before low with "a"

Signed and Sealed this
Second Day of January, 2024

Katherine Kelly Vidal
*Director of the United States Patent and Trademark Office*